(12) United States Patent
Stepanovic et al.

(10) Patent No.: US 11,581,901 B2
(45) Date of Patent: Feb. 14, 2023

(54) DIGITAL PRE-DISTORTION COMPENSATION OF DIGITAL-TO-ANALOG CONVERTER NON-LINEARITY

(71) Applicant: Apple Inc., Cupertino, CA (US)

(72) Inventors: Dusan Stepanovic, Mountain View, CA (US); Mansour Keramat, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/027,028

(22) Filed: Sep. 21, 2020

(65) Prior Publication Data

US 2022/0094369 A1   Mar. 24, 2022

(51) Int. Cl.
*H03M 1/66* (2006.01)
*H03M 3/00* (2006.01)

(52) U.S. Cl.
CPC ........... *H03M 3/358* (2013.01); *H03M 3/388* (2013.01)

(58) Field of Classification Search
CPC ........ H03M 1/68; H03M 3/358; H03M 3/388; H03M 1/0614; H03M 1/66; H03M 3/50; H03M 1/185; H03M 1/201
USPC .................................. 341/118–121, 143, 144
See application file for complete search history.

(56) References Cited

U.S. PATENT DOCUMENTS

| | | | |
|---|---|---|---|
| 4,459,580 A | 7/1984 | Furukawa | |
| 5,424,739 A * | 6/1995 | Norsworthy | G06F 1/0328 341/143 |
| 5,563,535 A * | 10/1996 | Corry | H03C 3/00 331/25 |
| 5,880,689 A * | 3/1999 | Kushner | G06J 1/00 341/118 |
| 6,204,788 B1 * | 3/2001 | Tani | H03M 1/0663 341/144 |
| 6,300,891 B1 * | 10/2001 | Tani | H03M 1/0665 341/143 |
| 6,567,026 B1 | 5/2003 | Gorman | |

(Continued)

OTHER PUBLICATIONS

Stepanovic et al., U.S. Appl. No. 17/027,064, entitled "Hybrid Digital-To-Analog Converter Non-Linearity Calibration", filed Sep. 21, 2020, 36 pages.

(Continued)

*Primary Examiner* — Linh V Nguyen
(74) *Attorney, Agent, or Firm* — Kowert Hood Munyon Rankin and Goetzel PC; Rory D. Rankin

(57) ABSTRACT

Systems, apparatuses, and methods for performing digital pre-distortion compensation of digital-to-analog converter non-linearity are described. A correction circuit receives a digital input word and couples a portion of the most significant bits (MSB's) of the digital input word to a correction lookup table (LUT). A correction value is retrieved from a correction LUT entry that matches the MSB's of the digital input word. Next, the correction value is added to the original digital input word in the digital domain. Then, the sum generated by adding the correction value to the original digital input word is optionally clipped if the sum exceeds the DAC core's input range. Next, the DAC core converts the sum into an analog value that is representative of the digital input word. The above approach helps to reduce non-linearities introduced by the DAC core in an energy-efficient manner by performing a correction in the digital domain.

20 Claims, 9 Drawing Sheets

(56) References Cited

U.S. PATENT DOCUMENTS

| | | |
|---|---|---|
| 6,621,440 B2 | 9/2003 | Gorman |
| 6,798,843 B1* | 9/2004 | Wright .................. H03F 1/3294 |
| | | 330/149 |
| 7,283,079 B2 | 10/2007 | Jain |
| 7,652,606 B2 | 1/2010 | Itoh et al. |
| 7,773,017 B1* | 8/2010 | He ...................... H03M 7/3031 |
| | | 341/143 |
| 8,164,495 B2 | 4/2012 | Agi |
| 8,681,026 B2 | 3/2014 | Xiao et al. |
| 8,717,216 B1 | 5/2014 | Motamed |
| 8,897,400 B2* | 11/2014 | Felbach .................... G06F 1/04 |
| | | 375/316 |
| 9,735,799 B1* | 8/2017 | Nguyen .................. H03M 1/06 |
| 10,044,367 B1* | 8/2018 | Azadet .................. H03M 7/304 |
| 10,218,371 B1* | 2/2019 | Zhuang ............... H03M 1/1038 |
| 2011/0109487 A1* | 5/2011 | Agi ..................... H03M 1/1052 |
| | | 341/120 |
| 2014/0118081 A1* | 5/2014 | Mahoney ................ H03M 3/50 |
| | | 332/103 |
| 2017/0033802 A1* | 2/2017 | O'Brien ................ H03M 3/458 |
| 2018/0218745 A1* | 8/2018 | Kamkar ................ G10L 19/167 |

OTHER PUBLICATIONS

Non-Final Office Action in U.S. Appl. No. 17/027,064, dated Apr. 19, 2021, 13 pages.

* cited by examiner

DIGITAL PRE-DISTORTION COMPENSATION OF DIGITAL-TO-ANALOG CONVERTER NON-LINEARITY

BACKGROUND

Technical Field

Embodiments described herein relate to the field of electronic circuits and, more particularly, to performing digital pre-distortion compensation of digital-to-analog converter non-linearity.

Description of the Related Art

Digital-to-analog converters (DACs) convert digital signals (i.e., a sequence of digital numbers) into an equivalent analog signal. The analog signal generated by a DAC is typically a voltage or a current signal. DAC's are usually implemented as a collection of cells (e.g., currents, capacitors, resistors). Many variations in the implementation of DAC cells exist (e.g. unary, binary, segmented). Independent of the implementation of the cells, most DACs can be modeled as a circuit in which each bit of the DAC digital input controls a cell of the appropriate size. For example, if the least significant bit (LSB) 0 cell size is 1, bit 1 cell size should be 2, bit 2 cell size should be 4, bit 3 cell size should be 8, and so on. In general, the size of the cell corresponding to the bit n is $2^n*u$, where u is the unit cell size. To reduce the area and power of the DAC it is desirable to minimize the size of the DAC cells as much as physically possible or as much as thermal noise specifications allow. This, however, increases random mismatches between DAC cells creating nonlinear errors.

SUMMARY

Systems, apparatuses, and methods for performing digital pre-distortion compensation of digital-to-analog converter (DAC) non-linearity are contemplated. In a traditional approach, for each input code of the main DAC, a code unit, such as a lookup table, outputs a code for a correction DAC that is chosen to minimize the nonlinear error. This increases the complexity of analog design and the size of the digital-to-analog interface. In one embodiment, rather than use the traditional analog correction approach, a digital pre-distortion (DPD) method is performed to correct the nonlinear errors in the digital domain, thereby maintaining a more compact design and a simpler interface. The proposed method can also be used when the performance of an existing DAC design needs to be improved without modifying sensitive and hard-to-verify analog circuits.

For example, in one embodiment, a correction circuit receives a digital input word and couples a portion of the most significant bits (MSB's) of the digital input word to a correction lookup table (LUT). A correction value is retrieved from a correction LUT entry that matches the portion of MSB's of the digital input word. Next, the correction value is added to the original digital input word in the digital domain. Then, the sum generated by adding the correction value to the original digital input word is optionally clipped if the addition caused the sum to exceed the range of the DAC core. Next, the sum is provided to the DAC core, and the DAC core converts the sum into an analog value that is representative of the digital input word. The above approach helps to reduce non-linearities introduced by the DAC core in an energy-efficient manner by performing the correction in the digital domain.

These and other embodiments will be further appreciated upon reference to the following description and drawings.

BRIEF DESCRIPTION OF THE DRAWINGS

The above and further advantages of the methods and mechanisms may be better understood by referring to the following description in conjunction with the accompanying drawings, in which.

Figure 1:
FIG. 1 is a generalized block diagram of one embodiment of an integrated circuit.

While the embodiments described in this disclosure may be susceptible to various modifications and alternative forms, specific embodiments thereof are shown by way of example in the drawings and will herein be described in detail. It should be understood, however, that the drawings and detailed description thereto are not intended to limit the embodiments to the particular form disclosed, but on the contrary, the intention is to cover all modifications, equivalents and alternatives falling within the spirit and scope of the appended claims.

The present disclosure includes references to "an embodiment" or groups of "embodiments" (e.g., "some embodiments" or "various embodiments"). Embodiments are different implementations or instances of the disclosed concepts. References to "an embodiment," "one embodiment," "a particular embodiment," and the like do not necessarily refer to the same embodiment. A large number of possible embodiments are contemplated, including those specifically disclosed, as well as modifications or alternatives that fall within the spirit or scope of the disclosure.

This disclosure may discuss potential advantages that may arise from the disclosed embodiments. Not all implementations of these embodiments will necessarily manifest any or all of the potential advantages. Whether an advantage is realized for a particular implementation depends on many factors, some of which are outside the scope of this disclosure. In fact, there are a number of reasons why an implementation that falls within the scope of the claims might not exhibit some or all of any disclosed advantages. For example, a particular implementation might include other circuitry outside the scope of the disclosure that, in conjunction with one of the disclosed embodiments, negates or diminishes one or more the disclosed advantages. Furthermore, suboptimal design execution of a particular implementation (e.g., implementation techniques or tools) could also negate or diminish disclosed advantages. Even assuming a skilled implementation, realization of advantages may still depend upon other factors such as the environmental circumstances in which the implementation is deployed. For example, inputs supplied to a particular implementation may prevent one or more problems addressed in this disclosure from arising on a particular occasion, with the result that the benefit of its solution may not be realized. Given the existence of possible factors external to this disclosure, it is expressly intended that any potential advantages described herein are not to be construed as claim limitations that must be met to demonstrate infringement. Rather, identification of such potential advantages is intended to illustrate the type(s) of improvement available to designers having the benefit of this disclosure. That such advantages are described permissively (e.g., stating that a particular advantage "may arise") is not intended to convey doubt about whether such advantages can in fact be realized, but rather to recognize the technical reality that realization of such advantages often depends on additional factors.

Unless stated otherwise, embodiments are non-limiting. That is, the disclosed embodiments are not intended to limit the scope of claims that are drafted based on this disclosure, even where only a single example is described with respect to a particular feature. The disclosed embodiments are intended to be illustrative rather than restrictive, absent any statements in the disclosure to the contrary. The application is thus intended to permit claims covering disclosed embodiments, as well as such alternatives, modifications, and equivalents that would be apparent to a person skilled in the art having the benefit of this disclosure.

For example, features in this application may be combined in any suitable manner. Accordingly, new claims may be formulated during prosecution of this application (or an application claiming priority thereto) to any such combination of features. In particular, with reference to the appended claims, features from dependent claims may be combined with those of other dependent claims where appropriate, including claims that depend from other independent claims. Similarly, features from respective independent claims may be combined where appropriate.

Accordingly, while the appended dependent claims may be drafted such that each depends on a single other claim, additional dependencies are also contemplated. Any combinations of features in the dependent that are consistent with this disclosure are contemplated and may be claimed in this or another application. In short, combinations are not limited to those specifically enumerated in the appended claims.

Where appropriate, it is also contemplated that claims drafted in one format or statutory type (e.g., apparatus) are intended to support corresponding claims of another format or statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to a singular form of an item (i.e., a noun or noun phrase preceded by "a," "an," or "the") are, unless context clearly dictates otherwise, intended to mean "one or more." Reference to "an item" in a claim thus does not, without accompanying context, preclude additional instances of the item. A "plurality" of items refers to a set of two or more of the items.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," and thus covers 1) x but not y, 2) y but not x, and 3) both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one element of the set [w, x, y, z], thereby covering all possible combinations in this list of elements. This phrase is not to be interpreted to require that there is at least one instance of w, at least one instance of x, at least one instance of y, and at least one instance of z.

Various "labels" may precede nouns or noun phrases in this disclosure. Unless context provides otherwise, different labels used for a feature (e.g., "first circuit," "second circuit," "particular circuit," "given circuit," etc.) refer to different instances of the feature. Additionally, the labels "first," "second," and "third" when applied to a feature do not imply any type of ordering (e.g., spatial, temporal, logical, etc.), unless stated otherwise.

The phrase "based on" or is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrases "in response to" and "responsive to" describe one or more factors that trigger an effect. This phrase does not foreclose the possibility that additional factors may affect or otherwise trigger the effect, either jointly with the specified factors or independent from the specified factors. That is, an effect may be solely in response to those factors, or may be in response to the specified factors as well as other, unspecified factors. Consider the phrase "perform A in response to B." This phrase specifies that B is a factor that triggers the performance of A, or that triggers a particular result for A. This phrase does not foreclose that performing A may also be in response to some other factor, such as C. This phrase also does not foreclose that performing A may be jointly in response to B and C. This phrase is also intended to cover an embodiment in which A is performed solely in response to B. As used herein, the phrase "responsive to" is synonymous with the phrase "responsive at least in part to." Similarly, the phrase "in response to" is synonymous with the phrase "at least in part in response to."

Within this disclosure, different entities (which may variously be referred to as "units," "circuits," other components, etc.) may be described or claimed as "configured" to perform one or more tasks or operations. This formulation [entity] configured to [perform one or more tasks] is used herein to refer to structure (i.e., something physical). More specifically, this formulation is used to indicate that this structure is arranged to perform the one or more tasks during operation. A structure can be said to be "configured to" perform some task even if the structure is not currently being operated. Thus, an entity described or recited as being "configured to" perform some task refers to something physical, such as a device, circuit, a system having a processor unit and a memory storing program instructions executable to implement the task, etc. This phrase is not used herein to refer to something intangible.

In some cases, various units/circuits/components may be described herein as performing a set of task or operations. It is understood that those entities are "configured to" perform those tasks operations, even if not specifically noted.

The term "configured to" is not intended to mean "configurable to." An unprogrammed FPGA, for example, would not be considered to be "configured to" perform a particular function. This unprogrammed FPGA may be "configurable to" perform that function, however. After appropriate programming, the FPGA may then be said to be "configured to" perform the particular function.

For purposes of United States patent applications based on this disclosure, reciting in a claim that a structure is "configured to" perform one or more tasks is expressly intended not to invoke 35 U.S.C. § 112(f) for that claim element. Should Applicant wish to invoke Section 112(f) during prosecution of a United States patent application based on this disclosure, it will recite claim elements using the "means for" [performing a function] construct.

Different "circuits" may be described in this disclosure. These circuits or "circuitry" constitute hardware that includes various types of circuit elements, such as combinatorial logic, clocked storage devices (e.g., flip-flops, registers, latches, etc.), finite state machines, memory (e.g., random-access memory, embedded dynamic random-access memory), programmable logic arrays, and so on. Circuitry may be custom designed, or taken from standard libraries. In various implementations, circuitry can, as appropriate, include digital components, analog components, or a combination of both. Certain types of circuits may be commonly referred to as "units" (e.g., a decode unit, an arithmetic logic unit (ALU), functional unit, memory management unit (MMU), etc.). Such units also refer to circuits or circuitry.

The disclosed circuits/units/components and other elements illustrated in the drawings and described herein thus include hardware elements such as those described in the preceding paragraph. In many instances, the internal arrangement of hardware elements within a particular circuit may be specified by describing the function of that circuit. For example, a particular "decode unit" may be described as performing the function of "processing an opcode of an instruction and routing that instruction to one or more of a plurality of functional units," which means that the decode unit is "configured to" perform this function. This specification of function is sufficient, to those skilled in the computer arts, to connote a set of possible structures for the circuit.

In various embodiments, as discussed in the preceding paragraph, circuits, units, and other elements defined by the functions or operations that they are configured to implement, The arrangement and such circuits/units/components with respect to each other and the manner in which they interact form a microarchitectural definition of the hardware that is ultimately manufactured in an integrated circuit or programmed into an FPGA to form a physical implementation of the microarchitectural definition. Thus, the microarchitectural definition is recognized by those of skill in the art as structure from which many physical implementations may be derived, all of which fall into the broader structure described by the microarchitectural definition. That is, a skilled artisan presented with the microarchitectural definition supplied in accordance with this disclosure may, without undue experimentation and with the application of ordinary skill, implement the structure by coding the description of the circuits/units/components in a hardware description language (HDL) such as Verilog or VHDL. The HDL description is often expressed in a fashion that may appear to be functional. But to those of skill in the art in this field, this HDL description is the manner that is used transform the structure of a circuit, unit, or component to the next level of implementational detail. Such an HDL description may take the form of behavioral code (which is typically not synthesizable), register transfer language (RTL) code (which, in contrast to behavioral code, is typically synthesizable), or structural code (e.g., a netlist specifying logic gates and their connectivity). The HDL description may subsequently be synthesized against a library of cells designed for a given integrated circuit fabrication technology, and may be modified for timing, power, and other reasons to result in a final design database that is transmitted to a foundry to generate masks and ultimately produce the integrated circuit. Some hardware circuits or portions thereof may also be custom-designed in a schematic editor and captured into the integrated circuit design along with synthesized circuitry. The integrated circuits may include transistors and other circuit elements (e.g. passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA. This decoupling between the design of a group of circuits and the subsequent low-level implementation of these circuits commonly results in the scenario in which the circuit or logic designer never specifies a particular set of structures for the low-level implementation beyond a description of what the circuit is configured to do, as this process is performed at a different stage of the circuit implementation process.

The fact that many different low-level combinations of circuit elements may be used to implement the same specification of a circuit results in a large number of equivalent structures for that circuit. As noted, these low-level circuit implementations may vary according to changes in the fabrication technology, the foundry selected to manufacture the integrated circuit, the library of cells provided for a particular project, etc. In many cases, the choices made by different design tools or methodologies to produce these different implementations may be arbitrary.

Moreover, it is common for a single implementation of a particular functional specification of a circuit to include, for a given embodiment, a large number of devices (e.g., millions of transistors). Accordingly, the sheer volume of this information makes it impractical to provide a full recitation of the low-level structure used to implement a single embodiment, let alone the vast array of equivalent possible implementations. For this reason, the present disclosure describes structure of circuits using the functional shorthand commonly employed in the industry.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112(f) for that unit/circuit/component.

In the following description, numerous specific details are set forth to provide a thorough understanding of the embodiments described in this disclosure. However, one having ordinary skill in the art should recognize that the embodiments might be practiced without these specific details. In some instances, well-known circuits, structures, and techniques have not been shown in detail for ease of illustration and to avoid obscuring the description of the embodiments.

DETAILED DESCRIPTION OF EMBODIMENTS

In the following description, numerous specific details are set forth to provide a thorough understanding of the embodiments described in this disclosure. However, one having ordinary skill in the art should recognize that the embodiments might be practiced without these specific details. In some instances, well-known circuits, structures, and techniques have not been shown in detail for ease of illustration and to avoid obscuring the description of the embodiments.

Referring to FIG. 1, a block diagram of one embodiment of an integrated circuit (IC) 100 is shown. In one embodiment, IC 100 includes source 110, digital pre-distortion compensation DAC 120, and load 130. In some embodiments, the components of IC 100 may actually be located in two or more separate IC's. Additionally, it should be understood that IC 100 may also include any number of other components (e.g., voltage regulator, capacitors, resistors) which are not shown to avoid obscuring the figure.

Source 110 is representative of any type of processing unit, control logic, memory device, or circuitry that provides digital input values to DAC 120. DAC 120 includes digital pre-distortion compensation to correct for conversion non-linearities in the digital domain rather than in the analog domain. Examples of different embodiments of DAC 120 will be presented throughout the remainder of this specification. Load 130 is representative of any type of circuit or logic for receiving the analog output generated by DAC 120. In one embodiment, the analog output may be processed and conveyed to another circuit or device after being received by load 130.

Figure 2:
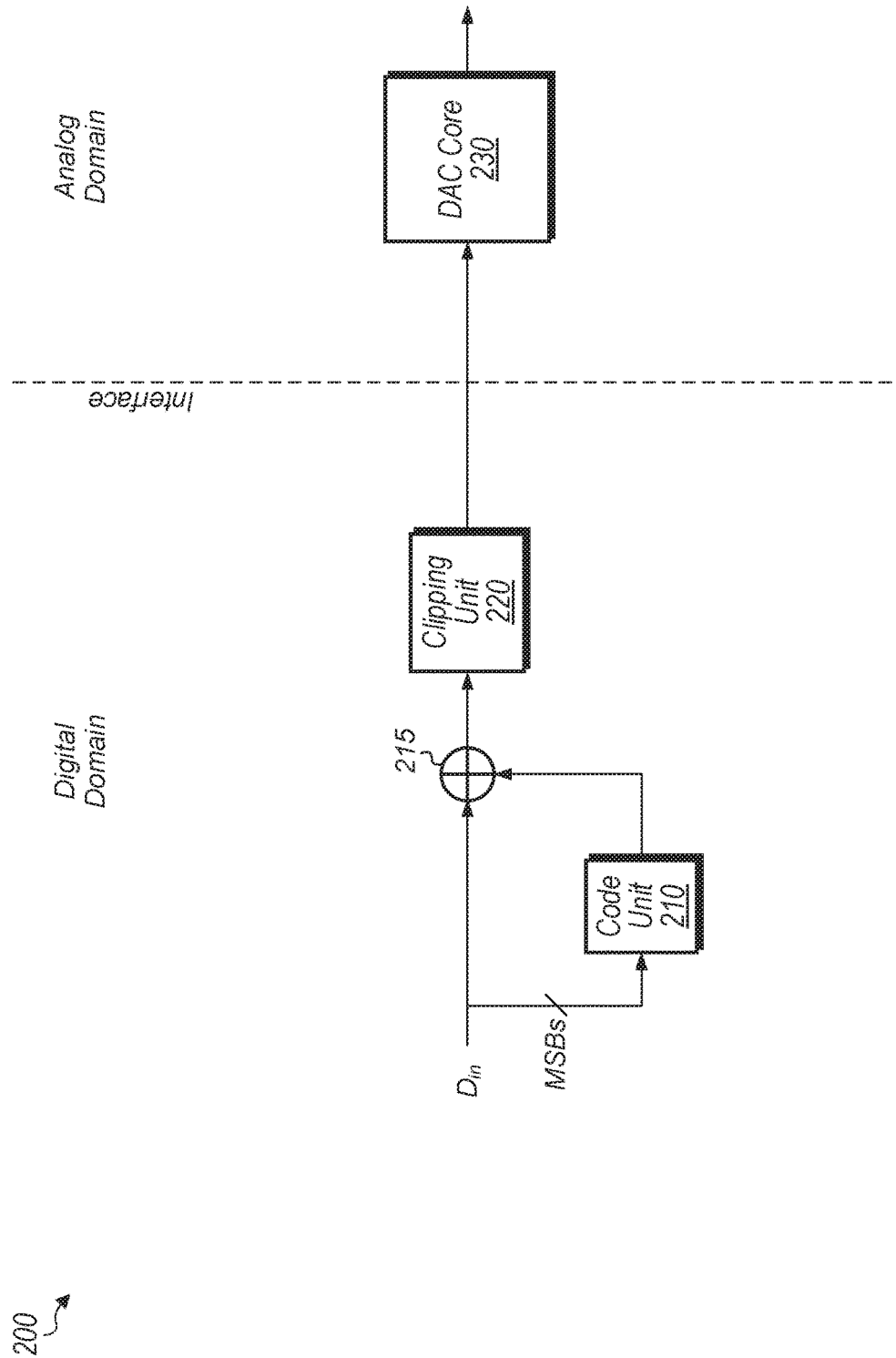
FIG. 2 is a generalized block diagram illustrating one embodiment of a non-linearity digital correction circuit.

Turning now to FIG. 2, a block diagram of one embodiment of a non-linearity digital correction circuit 200 is shown. For each digital input code provided to circuit 200, a correction value is determined via a code unit 210. In one embodiment, the code unit 210 is a lookup table (LUT) 210. However, embodiments other than a table are possible and are contemplated. As appreciated by those skilled in the art, a wide variety of entities and data structures can be used to associate an input with a corresponding output (e.g., hash structures, tree structures, etc.). Accordingly, while the description herein refers to a lookup table for ease of discussion, these other embodiments are possible and are contemplated. In one embodiment, to reduce the size of LUT 210, a portion of the digital input code bits are used as the input to LUT 210. For example, some number of most significant bits (MSBs) of the digital input code are coupled to LUT 210 and used for performing the lookup of LUT 210. In one embodiment, the lookup is performed with 4 MSBs of the digital input value. In other embodiments, other numbers of MSBs of the digital input value are provided to LUT 210.

In one embodiment, the correction values stored in LUT 210 are determined during a calibration process. During the calibration process, a certain number of input codes are processed by DAC core 230 with the correction circuitry disabled. For each input code provided to DAC core 230 during calibration, the corresponding analog output is measured either by a precise lab instrument or by an on-chip accurate analog-to-digital converter (ADC). For each input code, the difference between the expected analog output and the actual analog output is calculated and then further processed during calibration to determine the corresponding difference value that is stored in LUT 210 in an entry corresponding to the MSBs of the input code.

The output of LUT 210 is provided to digital adder 215, and the other input to digital adder 215 is the original digital input value. Digital adder 215 generates a sum of the output of LUT 210 and the original digital input value. The sum is provided to clipping unit 220 which clips the sum if the sum has exceeded the range of DAC core 230. As used herein, the term "clip" is defined as limiting the level a given value can reach to a predetermined threshold. If the sum does not exceed the range of DAC core 230, then the sum passes unchanged through clipping unit 220. The output of clipping unit 220 crosses the interface from the digital domain to the analog domain. This output of clipping unit 220 is provided to DAC core 230, with DAC core 230 using the output of clipping unit 220 to generate an analog value that is representative of the digital input value.

Figure 3:
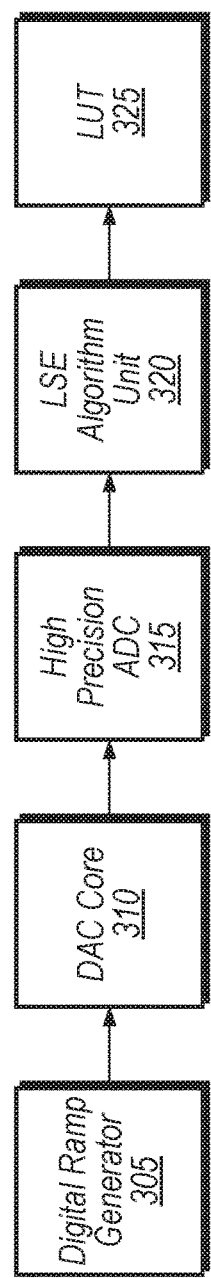
FIG. 3 is a block diagram of one embodiment of a calibration system.

Referring now to FIG. 3, a block diagram of one embodiment of a calibration system 300 is shown. In one embodiment, calibration system 300 includes digital ramp generator 305, DAC core 310, high-precision analog-to-digital converter (ADC) 315, least squares error (LSE) algorithm unit 320, and lookup table 325. In other embodiments, calibration system 300 may include other components and/or be structured differently than is shown in FIG. 3. For example, in another embodiment, high-precision ADC 315 is replaced with a multimeter. It is noted that LSE algorithm unit 320 may be implemented using any suitable combination of software (e.g., program instructions) and/or hardware (e.g., control logic). It should be understood that in other embodiments, other types of algorithms besides a LSE algorithm may be used in calibration system 300.

In one embodiment, digital ramp generator 305 generates a subset of input codes uniformly spaced across the full input range of DAC core 310. For example, 128 or 256 codes can be used for a 10-bit DAC core 310 when LUT 325 has a size of 16 in one particular embodiment. The relationship between the DAC inputs and the corresponding measured outputs (for this particular embodiment with a 10-bit DAC, 256 measured levels and desired size of LUT 325 with 16 entries) can be modeled as: $G \times D_{in,i} + O(D_{in,i}[9:6]) = V_{out,i}$, where i=0 . . . 255. In this equation, $D_{in}[9:6]$ are the 4 MSBs of the input to DAC core 310. This equation may also be written in matrix form as: $A \cdot GO = V_{out}$. In this matrix form equation, GO is the 17×1 vector of gain and input-dependent offsets and A is the matrix containing input codes in the first column and zeroes and ones in other columns as appropriate. $V_{out}$ is a column vector with measured DAC outputs.

In one embodiment, the above overdetermined system of equations and the solution for the gain G and the input-dependent offset O(j) are calculated using the LSE algorithm according to the formula: $GO = (A^T A)^{-1} A^T V_{out}$. In one embodiment, the correction values that are stored in LUT 325 are calculated as $LUT(j) = -O(j) \div G$, wherein j=0 . . . 15. It should be understood that the above equations are intended to represent one particular embodiment with a 10-bit digital input value and a 16-entry LUT 325. In other embodiments, the equations may be adjusted to match inputs with other bit-widths and/or other sizes of LUTs.

Figure 4:
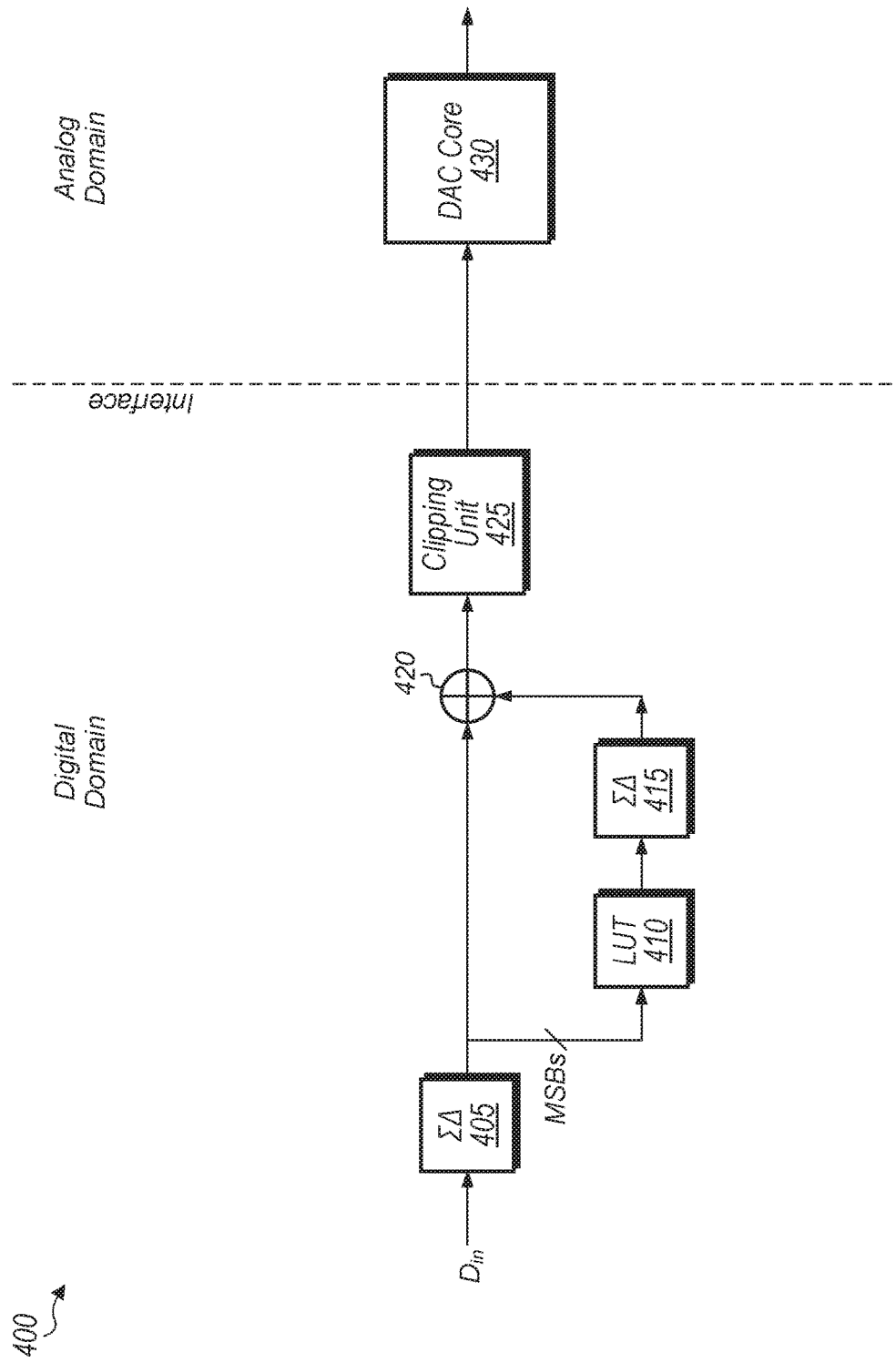
FIG. 4 is a block diagram of one embodiment of a correction circuit for reducing quantization noise.

Turning now to FIG. 4, a block diagram of one embodiment of a correction circuit 400 for reducing quantization noise is shown. In one embodiment, the spectral content of the digital input to DAC core 430 is lower than the Nyquist sampling rate and the digital input is available in a resolution higher than the resolution of DAC core 430. In this case, a sigma-delta modulator (ΣΔ) 405 converts extra fractional bits into integer bits to be applied to the input to DAC core 430. Accordingly, the quantization noise within the signal bandwidth is reduced. In this discussion, fractional bits refer to bits to the right of the radix point, and integer bits refer to bits to the left of the radix point. In some cases, the digital input value to correction circuit 400 may include integer and fractional bits. For example, a (10,2) digital input value may be received in one embodiment, with a (10, 2) value including 10 integer bits and 2 fractional bits. In other embodiments, other formats (i.e., other resolutions) of digital input values may be received, with more or fewer fractional bits. It is noted that the values stored in LUT 410 may be calculated with any suitable precision. If the analog side of DAC core 430 does not accept fractional bits, then the fractional bits in values output by LUT 410 are converted to integer values by using sigma-delta modulator 415. This helps to improve the signal-to-noise ratio (SNR) within the signal bandwidth.

As shown in FIG. 4, the output of sigma-delta modulator 415 is coupled to adder 420. Adder 420 generates the digital sum of the output of sigma-delta modulator 405 added to the output of sigma-delta modulator 415. The digital sum generated by adder 420 is optionally clipped by clipping unit 425 and then the output of clipping unit 425 is provided to DAC core 430. DAC core 430 converts the received digital value to its corresponding equivalent analog output. The analog output of DAC core 430 may be coupled to another circuit (not shown) for additional processing and/or transmission to another device or system.

Figure 5:
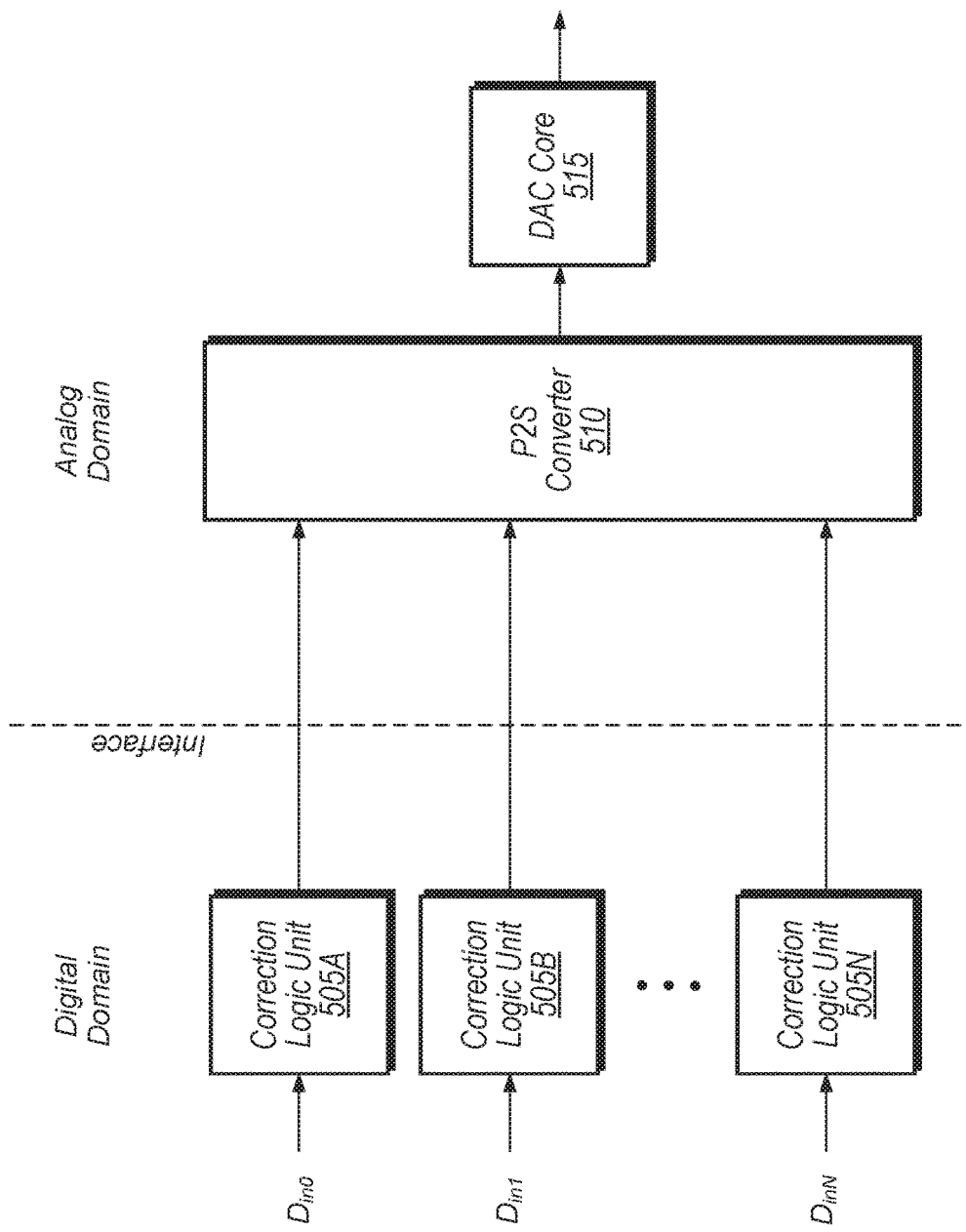
FIG. 5 is a block diagram of one embodiment of a high-speed application of a DAC non-linearity correction circuit.

Referring now to FIG. 5, a block diagram of one embodiment of a high-speed application of a DAC non-linearity correction circuit 500 is shown. As shown in FIG. 5, DAC 500 includes a plurality of correction logic units 505A-N. In one embodiment, there are four correction logic units 505A-N. In other embodiments, other numbers of correction logic units 505A-N are included in DAC correction circuit 500. Depending on the embodiment, correction logic units 505A-N may include the previously presented correction circuitry of either FIG. 2 or FIG. 4.

The outputs of correction logic units 505A-N are coupled to high-speed parallel-to-series (P2S) converter 510. P2S converter 510 couples one of the correction logic units 505A-N to DAC core 515 at any given time. After coupling the output of a given correction logic unit 505A-N for a given digital input value, P2S converter selects the next correction logic unit 505A-N for processing a subsequent digital input value. Once the output of the last correction logic unit 505A-N has been coupled through to DAC core 515, P2S converter 510 returns to the first correction logic unit 505A-N and couples the output of this unit through to DAC core 515. By using this approach, the maximum practical speed of the digital logic in correction logic units 505A-N is allowed to be lower than the sampling rate of DAC core 515.

Figure 6:
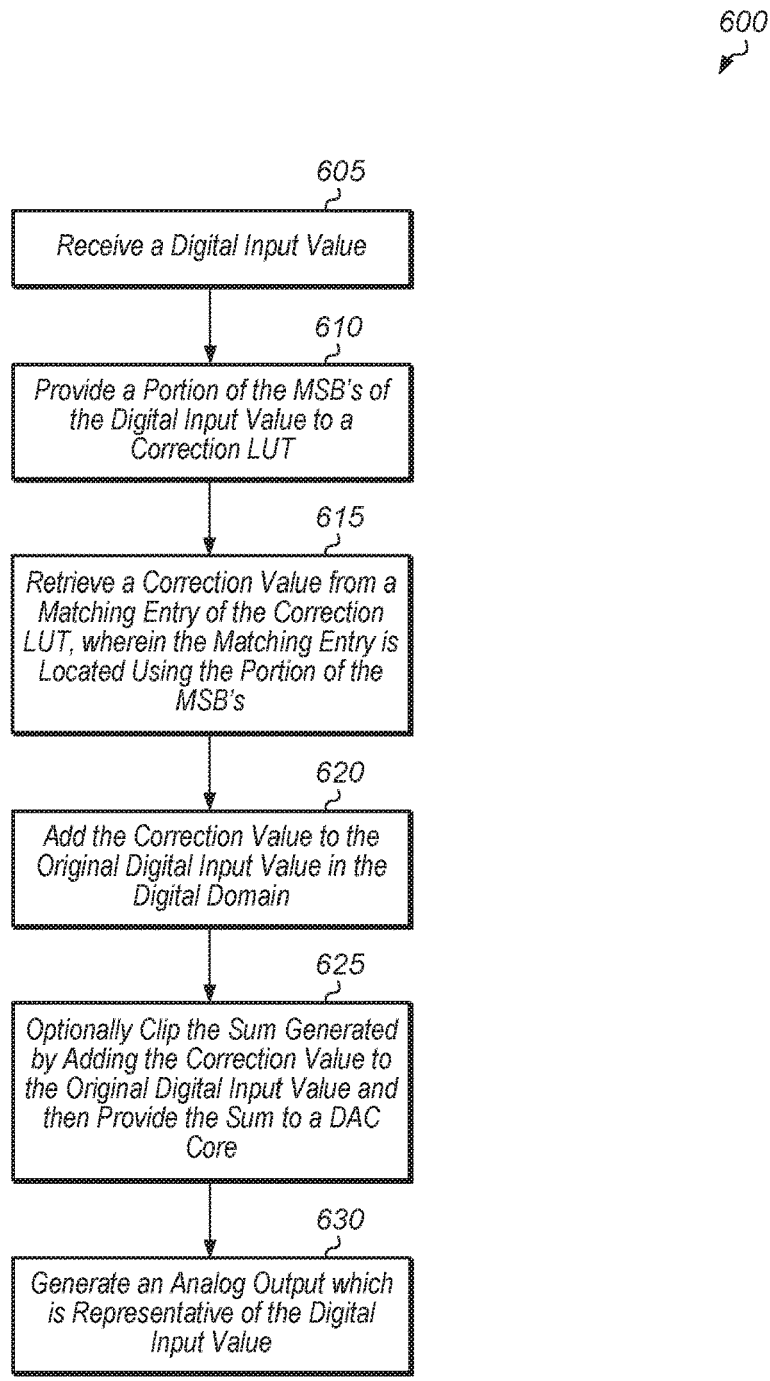
FIG. 6 is a flow diagram of one embodiment of a method for implementing digital pre-distortion compensation of DAC non-linearity.

Turning now to FIG. 6, a generalized flow diagram of one embodiment of a method 600 for implementing digital pre-distortion compensation of DAC non-linearity is shown. For purposes of discussion, the steps in this embodiment (as well as for FIGS. 7 and 8) are shown in sequential order. However, in other embodiments some steps may occur in a different order than shown, some steps may be performed concurrently, some steps may be combined with other steps, and some steps may be absent.

A DAC non-linearity correction circuit receives a digital input value (block 605). A portion of the MSB's of the digital input value are provided to a correction LUT (block 610). Next, a correction value is retrieved from a matching entry of the correction LUT, wherein the matching entry is located using the portion of the MSB's (block 615). Then, the correction value is added to the original digital input value in the digital domain (block 620). Next, the sum generated by adding the correction value to the original digital input value is optionally clipped and then provided to a DAC core (block 625). In one embodiment, the sum is clipped if adding the correction value to the original digital input value causes the sum to rollover. Then, the DAC core generates an analog output which is representative of the digital input value (block 630). After block 630, method 600 ends. After block 630, the analog output may be used to drive a load, may be transmitted to another device or circuit, or may be processed by another circuit. By performing the correction in the digital domain, non-linearities can be corrected for in a more energy-efficient manner than traditional analog domain approaches. Applying the correction allows the DAC to generate output signals with improved signal quality.

Figure 7:
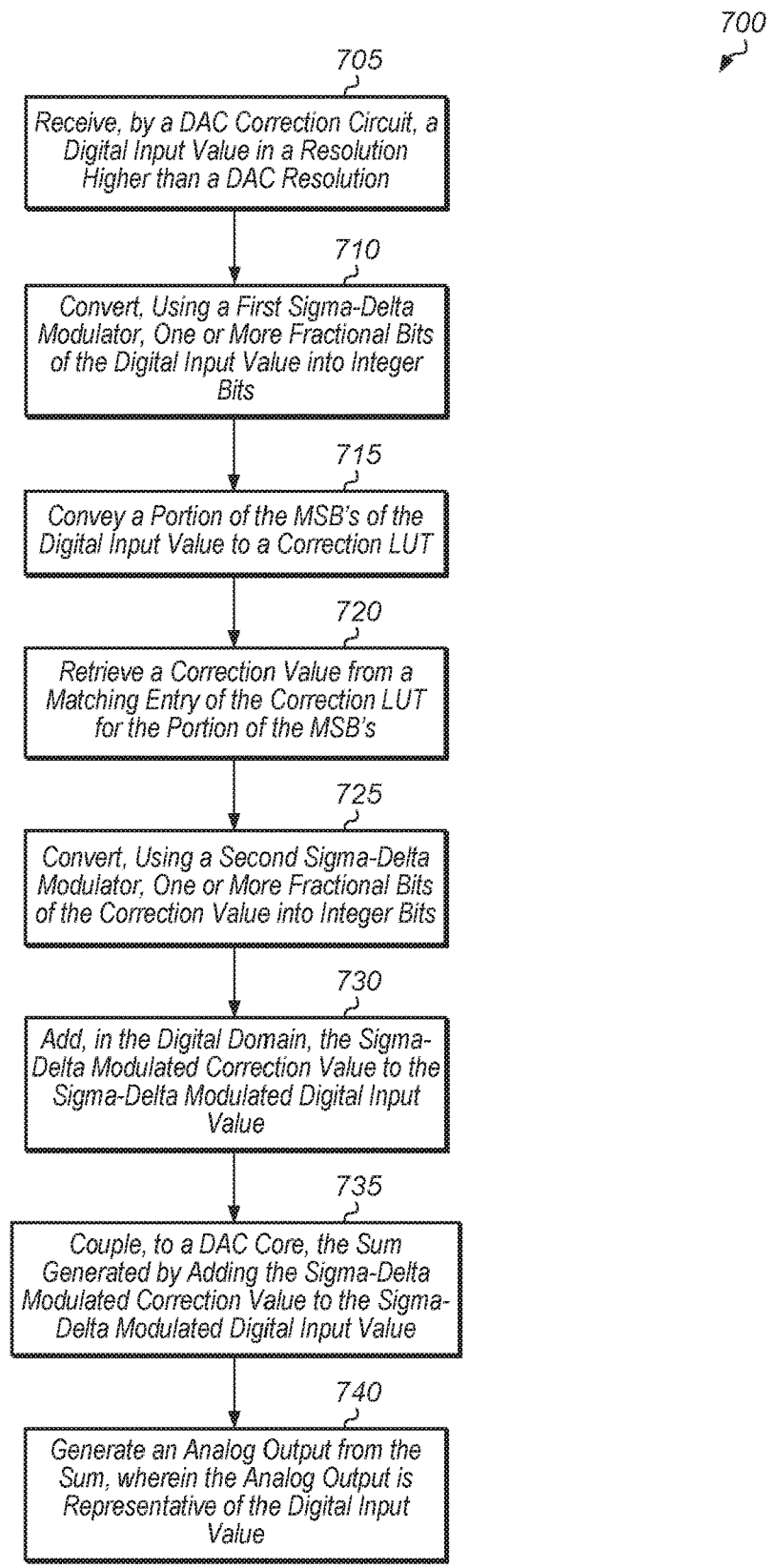
FIG. 7 is a flow diagram of one embodiment of a method for implementing a DAC correction circuit with a sigma-delta modulator.

Referring now to FIG. 7, one embodiment of a method 700 for implementing a DAC correction circuit with a sigma-delta modulator is shown. A digital input value in a resolution higher than a DAC resolution is received by a DAC correction circuit (block 705). A first sigma-delta modulator converts one or more fractional bits of the digital input value into integer bits (block 710). Also, a portion of the MSB's of the digital input value are conveyed to a correction LUT (block 715). Next, a correction value is retrieved from a matching entry of the correction LUT for the portion of the MSB's (block 720). Then, a second sigma-delta modulator converts one or more fractional bits of the correction value into integer bits (block 725). Next, the sigma-delta modulated correction value is added to the sigma-delta modulated digital input value in the digital domain (block 730). Next, the sum generated by adding the sigma-delta modulated correction value to the sigma-delta modulated digital input value is coupled to a DAC core (block 735). Then, the DAC core generates an analog output from the sum, wherein the analog output is representative of the digital input value (block 740). After block 740, method 700 ends.

Figure 8:
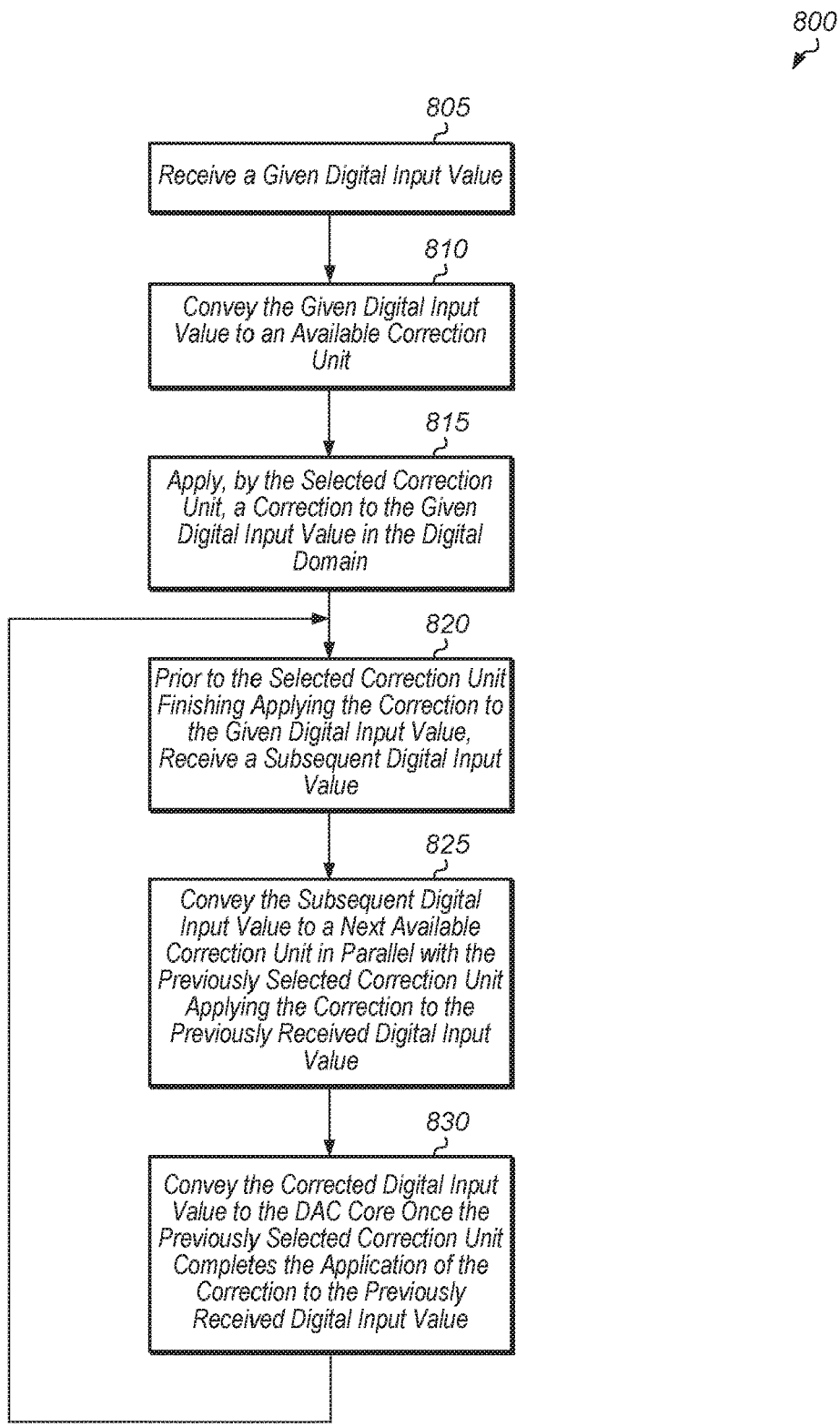
FIG. 8 is a flow diagram of one embodiment of a method for implementing parallel DAC non-linearity correction circuits.

Turning now to FIG. 8, one embodiment of a method 800 for implementing parallel DAC non-linearity correction circuits is shown. A selection circuit receives a given digital input value (block 805). The selection circuit conveys the given digital input value to an available correction unit (block 810). Next, the selected correction unit applies a correction to the given digital input value in the digital domain (block 815). Then, prior to the selected correction unit finishing applying the correction to the given digital input value, a subsequent digital input value is received by the selection circuit (block 820). The selection circuit conveys the subsequent digital input value to a next available correction unit in parallel with the previously selected correction unit applying the correction to the previously received digital input value (block 825). It is noted that any number of new digital input values may be received and conveyed to available correction units while the previously selected correction unit is applying the correction to the previously received digital input value, with the number varying according to the embodiment.

Next, the corrected digital input value is conveyed to the DAC core once the previously selected correction unit completes the application of the correction to the previously received digital input value (block 830). After block 830, method 800 returns to block 820. Method 800 can continue for as long as new digital input values continue to be received. It is noted that the selection circuit can be coupled to any number of correction units, with the number varying according to the embodiment.

Figure 9:
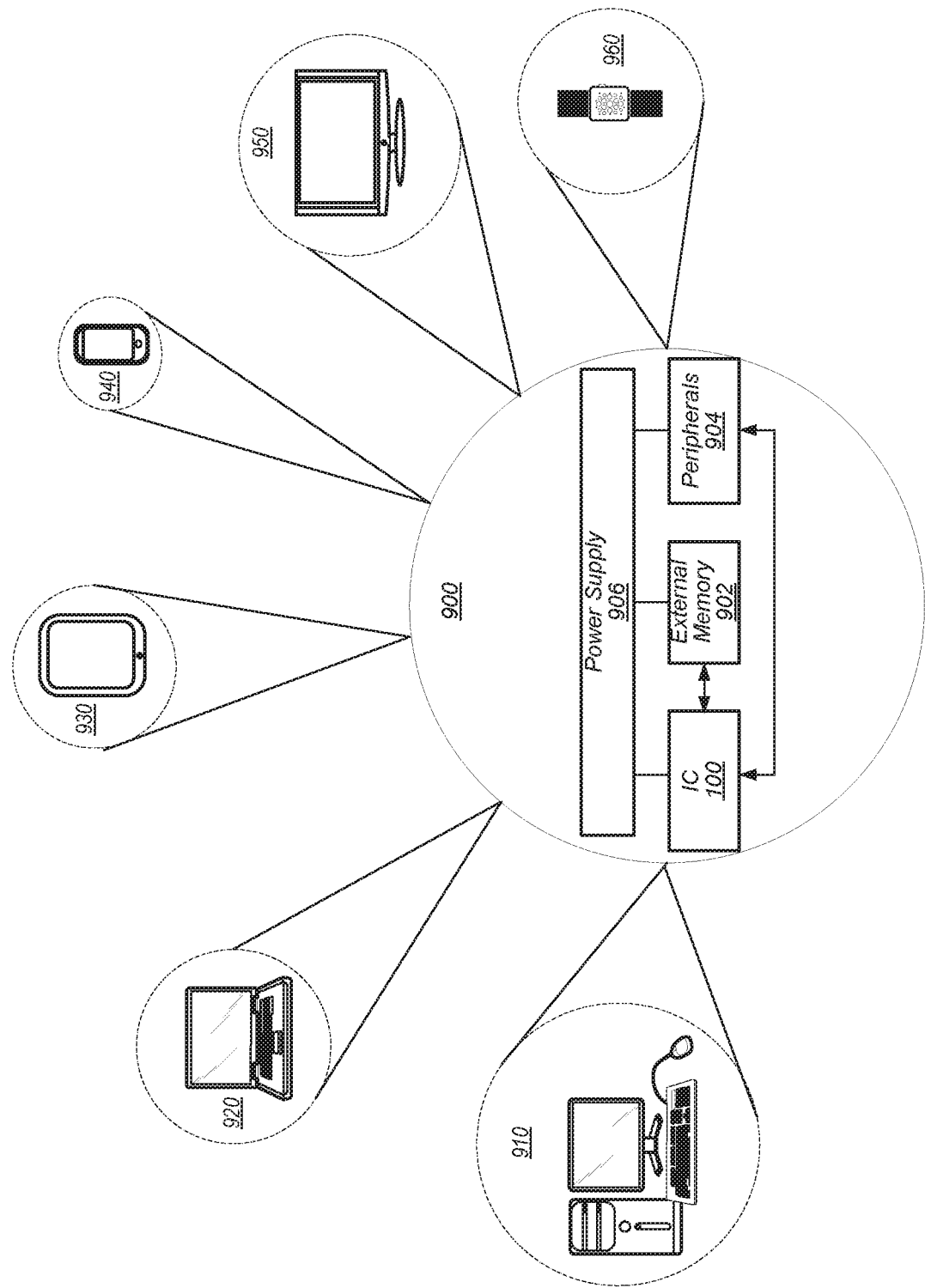
FIG. 9 is a block diagram of one embodiment of a system.

Referring now to FIG. 9, a block diagram of one embodiment of a system 900 is shown. As shown, system 900 may represent chip, circuitry, components, etc., of a desktop computer 910, laptop computer 920, tablet computer 930, cell or mobile phone 940, television 950 (or set top box configured to be coupled to a television), wrist watch or other wearable item 960, or otherwise. Other devices are possible and are contemplated. In the illustrated embodiment, the system 900 includes at least one instance of integrated circuit (IC) 100 (of FIG. 1) coupled to one or more peripherals 904 and the external memory 902. A power supply 906 is also provided which supplies the supply voltages to IC 100 as well as one or more supply voltages to the memory 902 and/or the peripherals 904. In various embodiments, power supply 906 may represent a battery (e.g., a rechargeable battery in a smart phone, laptop or tablet computer). In some embodiments, more than one instance of IC 100 may be included (and more than one external memory 902 may be included as well).

The memory 902 may be any type of memory, such as dynamic random access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR2, etc.), RAMBUS DRAM (RDRAM), static RAM (SRAM), etc. One or more memory devices may be coupled onto a circuit board to form memory modules such as single inline memory modules (SIMMs), dual inline memory modules (DIMMs), etc. Alternatively, the devices may be mounted with IC 100 in a chip-on-chip configuration, a package-on-package configuration, or a multi-chip module configuration.

The peripherals 904 may include any desired circuitry, depending on the type of system 900. For example, in one embodiment, peripherals 904 may include devices for various types of wireless communication, such as wife, Bluetooth, cellular, global positioning system, etc. The peripherals 904 may also include additional storage, including RAM storage, solid state storage, or disk storage. The peripherals 904 may include user interface devices such as a display screen, including touch display screens or multi-touch display screens, keyboard or other input devices, microphones, speakers, etc.

In various embodiments, program instructions of a software application may be used to implement the methods and/or mechanisms previously described. The program instructions may describe the behavior of hardware in a high-level programming language, such as C. Alternatively, a hardware design language (HDL) may be used, such as Verilog. The program instructions may be stored on a non-transitory computer readable storage medium. Numerous types of storage media are available. The storage medium may be accessible by a computer during use to provide the program instructions and accompanying data to the computer for program execution. In some embodiments, a synthesis tool reads the program instructions in order to produce a netlist comprising a list of gates from a synthesis library.

It should be emphasized that the above-described embodiments are only non-limiting examples of implementations. Numerous variations and modifications will become apparent to those skilled in the art once the above disclosure is fully appreciated. It is intended that the following claims be interpreted to embrace all such variations and modifications.

What is claimed is:

1. A circuit comprising:
 a code unit configured to store a plurality of correction values; and
 a digital-to-analog converter (DAC);
 wherein the circuit is configured to:
  receive a first digital input value in a resolution higher than supported by the DAC;
  convert, using a first sigma-delta modulator, one or more fractional bits of the first digital input value into integer bits of the first digital input value;
  access the code unit using a portion of most significant bits (MSB's) of the first digital input value;
  retrieve a first correction value of the plurality of correction values from the code unit as a result of the access; and
  convey, to the DAC, a first digital sum based at least in part on the first correction value and the first digital input value, wherein an analog output generated by the DAC for the first digital sum is an analog representation of the first digital input value.

2. The circuit as recited in claim 1, wherein the circuit is further configured to:
 access the code unit using a portion of most significant bits (MSB's) of a second digital input value;
 retrieve a second correction value of the plurality of correction values from the code unit as a result of the access; and
 clip a second digital sum of the second digital input value and the second correction value if a value of the second digital sum exceeds an input range of the DAC.

3. The circuit as recited in claim 1, wherein the first correction value is used for correcting a non-linear error of the DAC.

4. The circuit as recited in claim 1, wherein each of a number of bits in an integer portion of the first digital input value and a number of bits of the first digital sum is equal to a number of bits of an input of the DAC.

5. The circuit as recited in claim 1, wherein the first digital input value has more bits than said portion of MSB's.

6. The circuit as recited in claim 1, wherein the circuit is further configured to:
  convert, using a second sigma-delta modulator, one or more fractional bits of the first correction value into integer bits of the first correction value; and
  add, using a digital adder to generate the first digital sum, a first output value of the first sigma-delta modulator that receives the first digital input value and a second output value of the second sigma-delta modulator that receives the first correction value.

7. The circuit as recited in claim 1, further comprising a selection circuit and a plurality of correction circuits, wherein the selection circuit is configured to:
  convey a third digital input value to a first correction circuit of the plurality of correction circuits;
  receive a fourth digital input value prior to the first correction circuit completing processing of the third digital input value; and
  convey the fourth digital input value to a second correction circuit of the plurality of correction circuits in parallel with the first correction circuit processing the third digital input value.

8. A method comprising:
  receiving, by a digital correction circuit, a first digital input value in a resolution higher than supported by a digital-to-analog converter (DAC);
  converting, by a first sigma-delta modulator of the digital correction circuit, one or more fractional bits of the first digital input value into integer bits of the first digital input value;
  accessing, by the digital correction circuit, a code unit using a portion of most significant bits (MSB's) of the first digital input value;
  retrieving, by the digital correction circuit, a first correction value of a plurality of correction values from the code unit as a result of accessing the code unit; and
  conveying, to the DAC by the digital correction circuit, a first digital sum of based at least in part on the first correction value and the first digital input value to, wherein an analog output generated by the DAC for the first digital sum is an analog representation of the first digital input value.

9. The method as recited in claim 8, further comprising:
  accessing the code unit using a portion of most significant bits (MSB's) of a second digital input value;
  retrieving a second correction value of the plurality of correction values from the code unit as a result of the access; and
  clipping a second digital sum of the second digital input value and the second correction value if a value of the second digital sum exceeds an input range of the DAC.

10. The method as recited in claim 8, wherein the first correction value is used for correcting a non-linear error of the DAC.

11. The method as recited in claim 8, wherein each of a number of bits in an integer portion of the first digital input value and a number of bits of the first digital sum is equal to a number of bits of an input of the DAC.

12. The method as recited in claim 8, wherein the first digital input value has more bits than said portion of MSB's.

13. The method as recited in claim 8, further comprising:
  converting, using a second sigma-delta modulator, one or more fractional bits of the first correction value into integer bits of the first correction value; and
  adding, using a digital adder to generate the first digital sum, a first output value of the first sigma-delta modulator that receives the first digital input value and a second output value of the second sigma-delta modulator that receives the first correction value.

14. The method as recited in claim 8, further comprising:
  conveying, by a selection circuit, a first digital input value to a first correction unit of a plurality of correction units;
  receiving, by the selection circuit, a second digital input value prior to the first correction unit completing processing of the first digital input value; and
  conveying, by the selection circuit, the second digital input value to a second correction unit of the plurality of correction units in parallel with the first correction unit processing the first digital input value.

15. A system comprising:
  a digital-to-analog converter (DAC); and
  a digital correction circuit configured to:
    receive a first digital input value in a resolution higher than supported by the DAC;
    convert, using a first sigma-delta modulator, one or more fractional bits of the first digital input value into integer bits of the first digital input value;
    access a code unit using a portion of most significant bits (MSB's) of the first digital input value;
    retrieve a first correction value of a plurality of correction values from the code unit as a result of the access; and
    convey, to the DAC, a first digital sum ef based at least in part on the first correction value and the first digital input value, wherein an analog output generated by the DAC for the first digital sum is an analog representation of the first digital input value.

16. The system as recited in claim 15, wherein the digital correction circuit is further configured to:
  access the code unit using a portion of most significant bits (MSB's) of a second digital input value;
  retrieve a second correction value of the plurality of correction values from the code unit as a result of the access; and
  clip a second digital sum of the second digital input value and the second correction value if a value of the second digital sum exceeds an input range of the DAC.

17. The system as recited in claim 15, wherein first correction value is used for correcting a non-linear error of the DAC.

18. The system as recited in claim 15, wherein each of a number of bits in an integer portion of the first digital input value and a number of bits of the first digital sum is equal to a number of bits of an input of the DAC.

19. The system as recited in claim 15, wherein the first digital input value has more bits than said portion of MSB's.

20. The system as recited in claim 15, wherein the digital correction circuit is further configured to:
  convert, using a second sigma-delta modulator, one or more fractional bits of the first correction value into integer bits of the first correction value; and
  add, using a digital adder to generate the first digital sum, a first output value of the first sigma-delta modulator that receives the first digital input value and a second output value of the second sigma-delta modulator that receives the first correction value.

* * * * *

UNITED STATES PATENT AND TRADEMARK OFFICE
CERTIFICATE OF CORRECTION

PATENT NO. : 11,581,901 B2
APPLICATION NO. : 17/027028
DATED : February 14, 2023
INVENTOR(S) : Stepanovic et al.

It is certified that error appears in the above-identified patent and that said Letters Patent is hereby corrected as shown below:

In the Claims

Column 13, Claim 8, Line 38, please delete "sum of based" and insert -- sum based --.

Column 14, Claim 15, Line 30, please delete "sum ef based" and insert -- sum based --.

Signed and Sealed this
Twenty-first Day of March, 2023

Katherine Kelly Vidal
*Director of the United States Patent and Trademark Office*